United States Patent
Pritsker et al.

(10) Patent No.: US 11,902,132 B2
(45) Date of Patent: Feb. 13, 2024

(54) ANALOG-TO-DIGITAL CONVERTER OR DIGITAL-TO-ANALOG CONVERTER DATA PATH WITH DETERMINISTIC LATENCY

(71) Applicant: Intel Corporation, Santa Clara, CA (US)

(72) Inventors: Dan Pritsker, San Diego, CA (US); Colman Cheung, San Diego, CA (US); Benjamin Esposito, Pittsboro, NC (US)

(73) Assignee: Intel Corporation, Santa Clara, CA (US)

( * ) Notice: Subject to any disclaimer, the term of this patent is extended or adjusted under 35 U.S.C. 154(b) by 427 days.

(21) Appl. No.: 17/129,889

(22) Filed: Dec. 21, 2020

(65) Prior Publication Data
US 2022/0038357 A1 Feb. 3, 2022

Related U.S. Application Data

(60) Provisional application No. 63/059,698, filed on Jul. 31, 2020.

(51) Int. Cl.
*H04L 43/0852* (2022.01)
*G06F 13/38* (2006.01)
*H03M 1/66* (2006.01)
*H03M 1/12* (2006.01)

(52) U.S. Cl.
CPC ........ *H04L 43/0858* (2013.01); *G06F 13/387* (2013.01); *H03M 1/12* (2013.01); *H03M 1/66* (2013.01)

(58) Field of Classification Search
CPC .... H04L 43/0858; G06F 13/387; H03M 1/12; H03M 1/66
See application file for complete search history.

(56) References Cited

U.S. PATENT DOCUMENTS

2020/0097038 A1* 3/2020 Kinnerk ............... G06F 1/14

OTHER PUBLICATIONS

Texas Instrument, "JESD204B Deterministic Latency" (2016).*
Analog Device "JESD204B Survival Guide" (2014).*
Xie et al. "Application of Synchronous Acquisition Technology Based on JESD204B Protocol in Phased Array Radar" (2018), Texas Instrument.*
Guibord "JESD204B multi-device synchronization: Breaking down the requirements" (2Q 2015), IEEE.*
"JESD204B Deterministic Latency," Texas Instruments High Speed Data Converter Training, pp. 1-50, 2016.
"JESD204B Overview," Texas Instruments High Speed Data Converter Training, pp. 1-32, 2016.

* cited by examiner

*Primary Examiner* — Jae Y Lee
(74) *Attorney, Agent, or Firm* — InventIQ Legal LLP; Steven J. Cahill

(57) ABSTRACT

A circuit system includes an analog-to-digital converter circuit, a digital-to-analog converter circuit coupled to the analog-to-digital converter circuit, and a variable latency circuit coupled to a data path that includes the digital-to-analog converter circuit. The variable latency circuit generates a deterministic latency in an output signal that is based on a measured latency of the data path.

20 Claims, 10 Drawing Sheets

ANALOG-TO-DIGITAL CONVERTER OR DIGITAL-TO-ANALOG CONVERTER DATA PATH WITH DETERMINISTIC LATENCY

CROSS REFERENCE TO RELATED APPLICATION

This application claims the benefit of U.S. Provisional Patent Application No. 63/059,698, filed Jul. 31, 2020, which is incorporated by reference herein in its entirety.

FIELD OF THE DISCLOSURE

The present disclosure relates to electronic devices having analog-to-digital conversion (ADC) or digital-to-analog conversion (DAC) data paths with deterministic latency.

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

A phased array of sensors (e.g., receivers) or transmitters, such as antennas, microphones, or speakers, may be used to detect or transmit a signal in a particular spatial direction in relation to the phased array. By detecting or transmitting a signal through the phased array at specific offsets in time, that is, using different phase offsets for different sensors or transmitters, the signal may be detected or transmitted in a particular spatial direction. Consider the case of signal detection. A signal arriving at an array of sensors from a particular spatial direction may reach different sensors at different times (e.g., closer sensors first). Thus, selecting specific offsets in time for different sensors causes the results, when added together, to experience constructive interference in that particular spatial direction. Transmitting a signal in a particular direction may operate in a similar way. A signal to be transmitted may be provided to different elements of an array of transmission elements, such as antennas or speakers, at different offsets in time. By selecting specific offsets in time, the resulting transmission signals can be made to constructively interfere (that is, add to one another) in a desired spatial direction.

Active Electronically Scanned Arrays (AESA) are one type of phased array that may include hundreds or even thousands of independent transmit/receive radiating elements. Behind each radiating element there is an analog signal conditioning chain that terminates with an analog-to-digital converter (ADC) or digital-to-analog converter (DAC). These ADC and DAC circuits serve as a boundary between the continuous analog domain and the digital domain containing discrete samples. AESA systems allow for the implementation of a variety of system-level applications that enable next generation systems that are flexible, agile, and resilient to interference.

DETAILED DESCRIPTION OF SPECIFIC EMBODIMENTS

Figure 1:
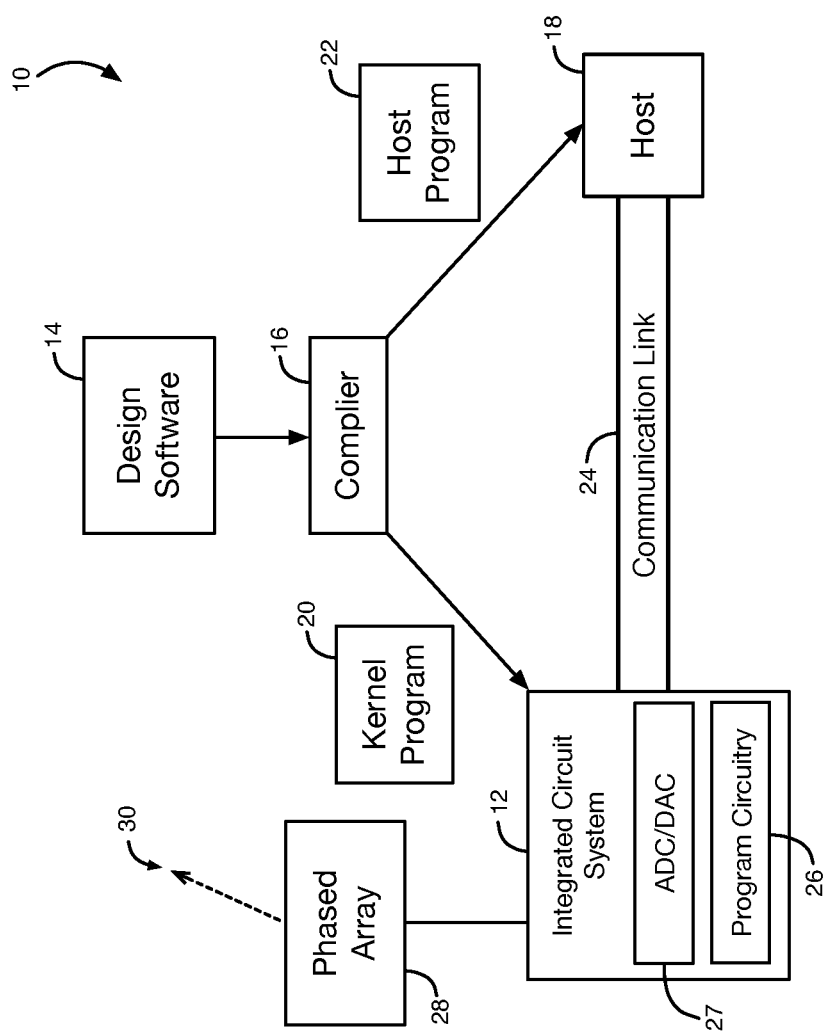
FIG. 1 illustrates a block diagram of a system that may use analog-to-digital converter (ADC) circuitry or digital-to-analog converter (DAC) circuitry calibrated to have deterministic latency to send or receive data via a phased array, according to an embodiment.

One or more specific embodiments are described below. In an effort to provide a concise description of these embodiments, not all features of an actual implementation are described in this specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

An integrated circuit (IC), such as a programmable logic device (PLD) like a field programmable gate array (FPGA), may use transceivers to send or receive data via a phased array. For many phased array uses, precise phase offsets are selected for different elements of the phased array. As mentioned above, Active Electronically Scanned Arrays (AESA) are one type of phased array that may include hundreds or even thousands of independent transmit/receive radiating elements.

Many algorithms and applications for AESA take advantage of coherent receiving and transmitting across many spatially distributed elements. To achieve coherent reception or transmission, the receive or transmit path may maintain a deterministic relative propagation delay to each element in the phased array. The deterministic relative propagation delay to each element is used for the operation of digital data processing algorithms. The ADC and DAC circuits in the system are often designed to have a hard deterministic latency, meaning that the architectures of the ADC and DAC circuits are designed to cause a constant delay through each of the DAC/ADC circuits. However, hard deterministic latency ADC and DAC circuits in AESA may be complex and costly in terms of the die area of an integrated circuit system. Latency refers to the total time for a signal to travel from one point to another point. Deterministic latency refers to a constant latency for a signal propagating through a signal path.

Instead of designing DAC and ADC circuits in a phased array to have hard deterministic latency, some circuits and systems disclosed herein may include a data path that is designed without the DAC and ADC circuits being constrained to having hard deterministic latency. These circuits and systems may allow the implementation of higher performing and more economical data converters. It may be advantageous to provide an ADC and a DAC for a phased array in the same integrated circuit die or integrated circuit package. In some embodiments, a loopback path is provided from a DAC data path to an ADC data path for the purpose of system test and verification. The loopback path from the DAC data path to the ADC data path (or alternatively from the ADC data path to the DAC data path) may be used to measure the latency of the DAC (or the ADC) data path. The latency of the DAC (or the ADC) data path may then be tuned based on the measured latency to cause the DAC (or the ADC) data path to have deterministic latency. In this context, a data path refers to the circuits and conductors (e.g., wires) that transmit data from a starting point to an ending point.

Figure (FIG.) 1 illustrates a block diagram of a system 10 that may use analog-to-digital converter (ADC) circuitry or digital-to-analog converter (DAC) circuitry calibrated to have deterministic latency to send or receive data via a phased array, according to an embodiment. A designer may desire to implement functionality, such as program circuitry to communicate via a phased array, on an integrated circuit (IC) system 12. The IC system 12 may be, for example, a field-programmable gate array (FPGA), an application-specific integrated circuit (ASIC), a microprocessor integrated circuit (IC), a central processing unit IC, or a graphics processing unit (GPU). In some cases, the designer may specify a high-level program to be implemented, such as an OpenCL program, which may enable the designer to more efficiently and easily provide programming instructions to configure a set of programmable logic cells for the integrated circuit system 12 without specific knowledge of low-level hardware description languages (e.g., Verilog or VHDL). For example, because OpenCL is similar to other high-level programming languages, such as C++, designers of programmable logic familiar with such programming languages may have a reduced learning curve than designers that are required to learn unfamiliar low-level hardware description languages to implement new functionalities in the integrated circuit system 12.

A designer may implement high-level designs using design software 14, such as a version of Intel® Quartus® Prime by INTEL CORPORATION, to create a high-level program. The design software 14 may use a compiler 16 to convert the high-level program into a lower-level description. The compiler 16 may provide machine-readable instructions representative of the high-level program to a host 18 and to the integrated circuit system 12. The host 18 may receive a host program 22, which may be implemented by kernel programs 20. To implement the host program 22, the host 18 may communicate instructions from the host program 22 to the integrated circuit system 12 via a communications link 24, which may be, for example, direct memory access (DMA) communications or peripheral component interconnect express (PCIe) communications. While the techniques described above refer to the application of a high-level program, in some embodiments, a designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

The kernel programs 20 may enable configuration of program circuitry 26 in the integrated circuit system 12. The program circuitry 26 may represent a circuit design of the kernel program 20 that is configured into the integrated circuit system 12 (e.g., formed in soft logic). In some embodiments, the program circuitry 26 may be partially or fully formed in hardened circuitry (e.g., application-specific circuitry of the integrated circuit that is not configurable as programmable logic). Analog-to-digital conversion (ADC) circuitry and digital-to-analog conversion (DAC) circuitry 27 may be calibrated using a loopback path to provide an effectively deterministic signal path, as disclosed in further detail herein with respect to FIGS. 4-9. The host 18 may use the communication link 24 to cause the program circuitry 26 to detect or transmit a signal in a particular spatial direction in relation to a phased array 28.

The phased array 28 may include any suitable number and/or type of phased array elements. For example, the phased array 28 may include an array of sensors, such as an array of microphones or radio frequency (RF) antenna elements, that may receive signals. The phased array 28 may also include an array of transmitter elements, such as an array of speakers or RF antenna elements.

The program circuitry 26 may control the phased array 28 to form a beam 30. The program circuitry 26 may detect or transmit a signal at the beam 30 in a particular spatial direction in relation to the phased array 28. By detecting or transmitting a signal through the various elements of the phased array 28 at specific offsets in time, that is, using different phase offsets for different sensors or transmitters, the beam 30 may focus on a particular spatial direction. In the case of signal detection, a signal arriving at the phased array 28 from a particular spatial direction may reach different sensors at different times (e.g., closer sensors first). Thus, selecting specific offsets in time for the different sensors causes the output of the sensors, when added together, to be sensitive to that particular spatial direction (e.g., as shown by the direction of beam 30). Transmitting a signal in a particular direction may operate in a similar way when the phased array 28 contains several transmitter elements. A signal to be transmitted may be provided to the different elements of the phased array 28 at different offsets in time. By selecting specific offsets in time for the signal, the resulting transmission signals can be made to constructively interfere (that is, add to one another) in a desired spatial direction to form the beam 30.

Consider, as an example, that the phased array 28 represents an array of microphones at the front of a room. Sound waves coming from a sound source at a location in the room may propagate from the sound source to the microphones. Because each microphone in the array of microphones has a different spatial position in relation to one another, the sound from the sound source may reach the different microphones at different times. By sampling from the microphones according to different specific phase offsets for a specific spatial direction toward the location of the sound source, a signal representing sound waves coming from the sound source may be obtained (because those sounds add together in constructive interference) and other sounds may be excluded (because those sounds cancel each other out through destructive interference). Similar principles apply for arrays of other sensors or transmitters, such as radiofrequency (RF) antennas or audio speakers.

Figure 2:
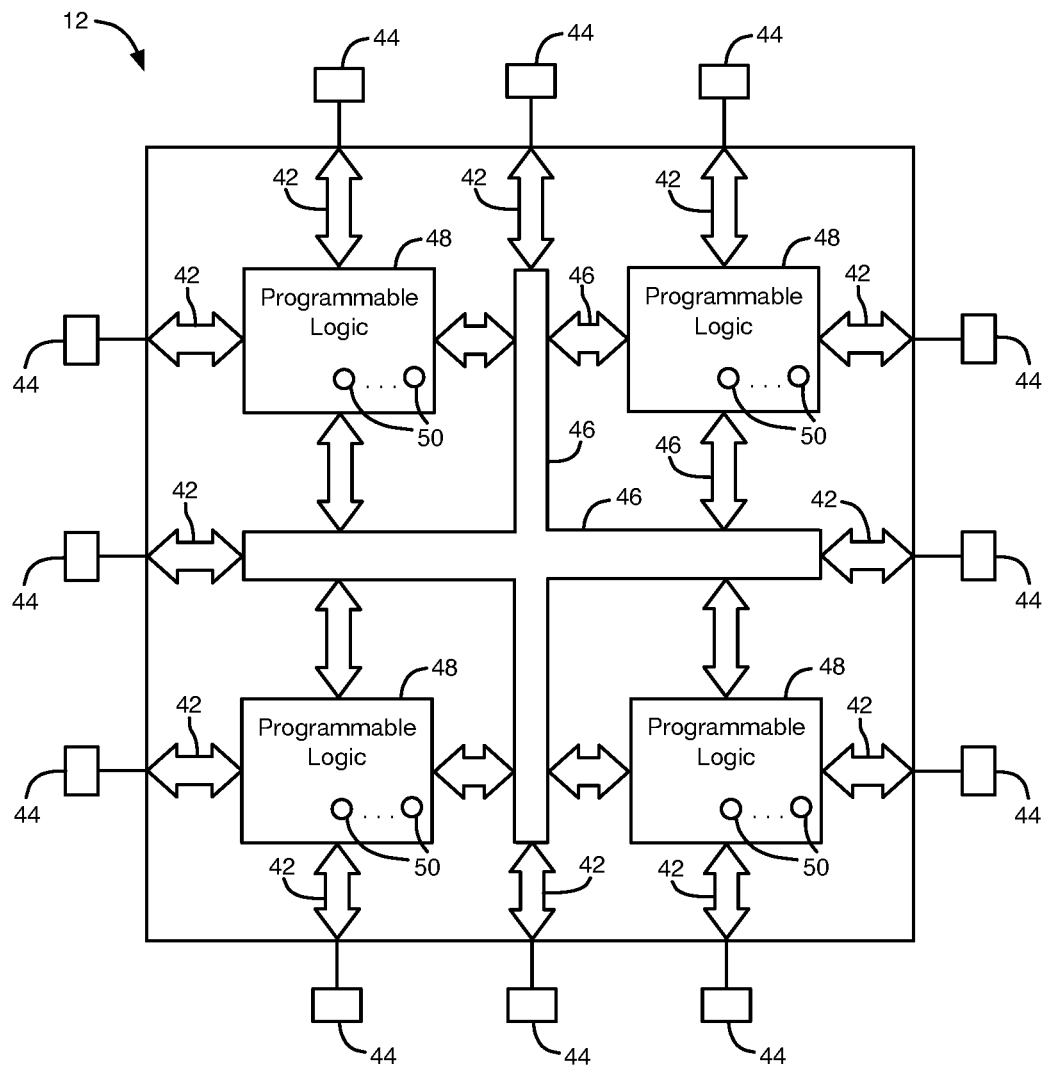
FIG. 2 illustrates an example of the integrated circuit system of FIG. 1 as a programmable logic device, such as a field programmable gate array (FPGA).

FIG. 2 illustrates an example of the integrated circuit system 12 of FIG. 1 as a programmable logic device, such as a field programmable gate array (FPGA). The integrated circuit system 12 may be any other suitable type of integrated circuit device (e.g., an application-specific integrated circuit and/or application-specific standard product). As shown in FIG. 2, the integrated circuit system 12 may have input/output circuitry 42 for driving signals off the system 12 and for receiving signals from other devices via input/output pads 44. Interconnection resources 46, such as global and local vertical and horizontal conductors and buses, may be used to route signals on integrated circuit system 12. Additionally, interconnection resources 46 may include fixed interconnects (conductors) and programmable interconnects (e.g., programmable connections between respective fixed interconnects). Programmable logic 48 may include combinational and sequential logic circuitry, as well as digital signal processing (DSP) circuitry. For example, programmable logic 48 may include look-up tables, registers, and multiplexers. In various embodiments, the programmable logic 48 may be programmed with a configuration that performs a custom logic function. The programmable interconnects associated with interconnection resources 46 may be a part of the programmable logic 48.

Programmable logic devices, such as the integrated circuit system 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically programmable read-only-memory technology, random-access memory cells, non-volatile memory, mask-programmed elements, and so forth.

Many programmable logic devices are electrically programmed. With electrical programming arrangements, the programmable elements 50 may be formed from one or more memory cells. For example, during programming, configuration data is loaded into the memory cells using pads 44 and input/output circuitry 42. In one embodiment, the memory cells may be implemented as random-access-memory (RAM) cells. The use of memory cells based on RAM technology is intended to be only one example. Further, because these RAM cells are loaded with configuration data during programming, these RAM cells are sometimes referred to as configuration RAM cells (CRAM). These memory cells may each provide a corresponding static control output signal that controls the state of an associated logic component in programmable logic 48. For instance, in some embodiments, the output signals of the memory cells may be applied to the gates of metal-oxide-semiconductor (MOS) transistors within the programmable logic 48.

Figure 3:
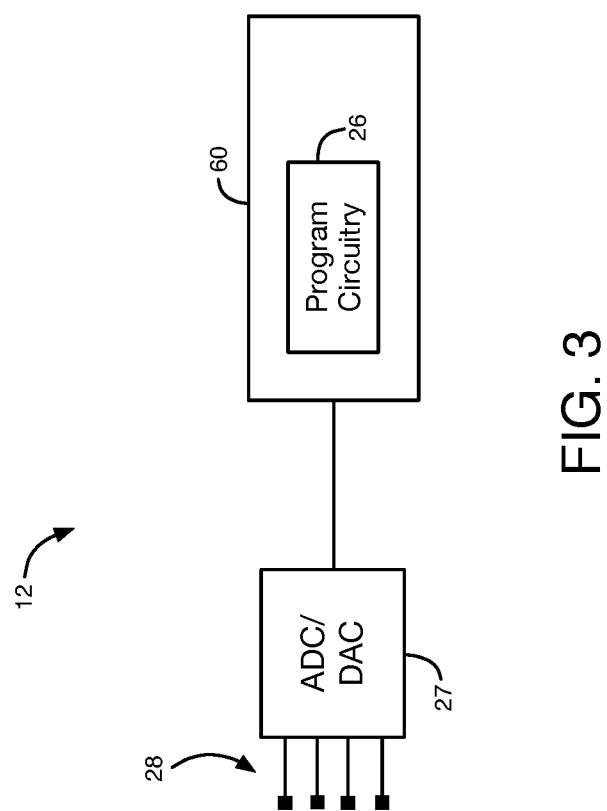
FIG. 3 illustrates an example of the integrated circuit system of FIG. 1 that includes ADC/DAC circuitry and program circuitry in separate integrated circuits, according to an embodiment.

The integrated circuit system 12 may be a single monolithic device or may include two or more integrated circuit dies. For example, as shown in FIG. 3, the integrated circuit system 12 may include separate integrated circuit dies (e.g., chiplets). Figure (FIG. 3 illustrates an example of the integrated circuit system 12 of FIG. 1 that includes the ADC/DAC circuitry 27 and the program circuitry 26 in separate integrated circuit dies, according to an embodiment. In the example of FIG. 3, the program circuitry 26 is programmed on an FPGA integrated circuit (IC) die 60, and the ADC/DAC circuitry 27 is in another integrated circuit die that is separate from IC die 60. The phased array 28 is coupled to the ADC/DAC circuitry 27.

JESD204B is a standardized serial interface between data converters (ADCs and DACs) and logic devices (e.g., FPGAs, processors, or ASICs). The serial interface may be implemented using high-speed serial data lanes. A system that implements JESD204B may use a phase compensating first-in-first-out (FIFO) buffer circuit to compensate for clock domain transfers across a data path. In some instances, the FIFO buffer circuit may introduce latency uncertainty into the data path. The JESD204B standard is only responsible for deterministic latency of the link between the data converter and the logic device. The JESD204B standard does not determine the latency of the data converters. Therefore, the data converters must have deterministic latency outside the boundaries of the data lanes, according to the JESD204B standard. JESD204B also defines that a transmitter (TX) generates timing information, and a receiver (RX) is aligned according to the timing information generated by the transmitter. In this context, TX and RX refer to the serial link interface only. For the input data to the system, the ADC is the transmitter (TX), and the logic device is the receiver (RX). For the output data of the system, the DAC is the receiver (RX), and the logic device is the transmitter (TX).

Figure 4:
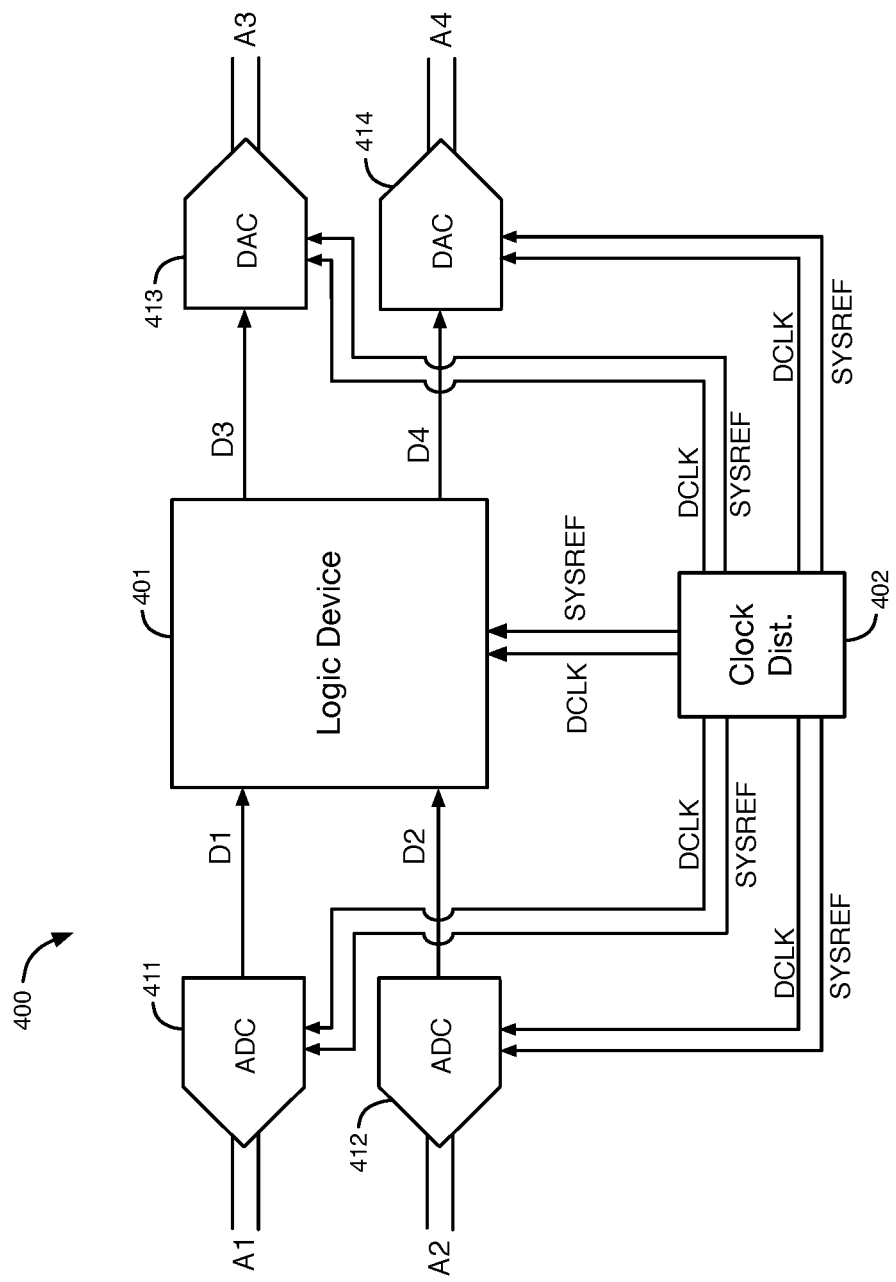
FIG. 4 illustrates an example of a circuit system that implements an interface between data converters and a logic device, according to an embodiment.

FIG. 4 illustrates an example of a circuit system 400 that implements an interface between data converters and a logic device 401, according to an embodiment. Circuit system 400 includes logic device 401, clock distribution circuit 402, analog-to-digital converter (ADC) circuits 411 and 412, and digital-to-analog converter (DAC) circuits 413 and 414. ADC circuits 411-412 and DAC circuits 413-414 are the data converters. Circuit system 400 may be implemented using multiple integrated circuit dies or a single integrated circuit die. As examples, logic device 401, clock circuit 402, ADC circuits 411-412, and DAC circuits 413-414 may all be in a single integrated circuit die or in 2 or more separate integrated circuit dies. Circuit system 400 is an example of integrated circuit system 12.

Circuit system 400 may, as an example, implement the JESD204B standardized serial interface between data converters 411-414 and logic device 401. In circuit system 400, clock distribution circuit 402 generates a device clock signal DCLK and a synchronization signal SYSREF for each device. According to the JESD204B standard, signal SYSREF is source synchronous with the device clock signal DCLK. Signals DCLK and SYSREF are provided through conductors in system 400 to each of logic device 401, ADC circuit 411, ADC circuit 412, DAC circuit 413, and DAC circuit 414, as shown in FIG. 4. In some embodiments, each of logic device 401, ADC circuit 411, ADC circuit 412, DAC circuit 413, and DAC circuit 414 receive the same device clock signal DCLK and the same synchronization signal SYSREF. In other embodiments, logic device 401, ADC circuit 411, ADC circuit 412, DAC circuit 413, and DAC circuit 414 receive different device clock signals DCLK and different SYSREF signals. The different DCLK and SYSREF signals provided to logic device 401, ADC circuit 411, ADC circuit 412, DAC circuit 413, and DAC circuit 414 may be derived from the same source clock signal(s) to allow for synchronous data capture between these devices.

Differential analog input signals A1 and A2 are provided to inputs of ADC circuits 411 and 412, respectively. ADC circuits 411 and 412 convert analog signals A1 and A2 into digital signals D1 and D2, respectively, in response to signals DCLK and SYSREF. Digital signals D1 and D2 are provided to inputs of logic device 401. Logic device 401 generates digital output signals D3 and D4, for example, based on digital signals D1 and D2. Digital signals D3 and D4 are provided from logic device 401 to inputs of DAC circuits 413 and 414, respectively. DAC circuits 413 and 414 convert digital signals D3 and D4 into differential analog output signals A3 and A4, respectively, in response to signals DCLK and SYSREF.

Figure 5:
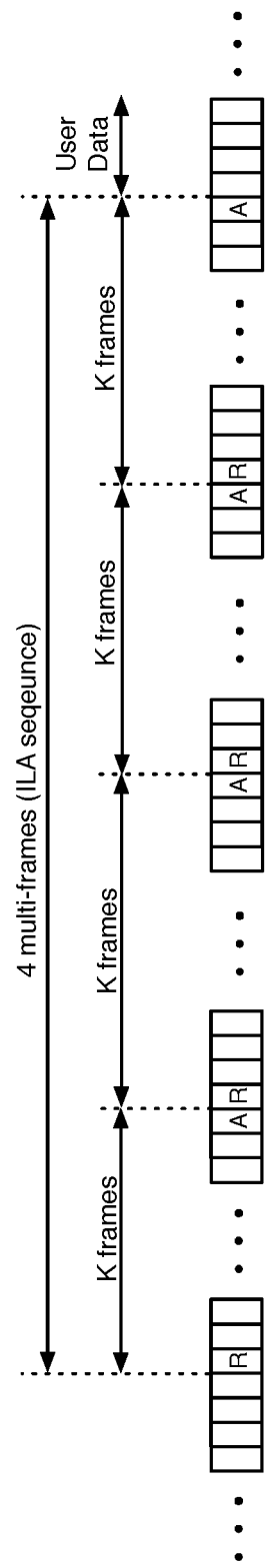
FIG. 5 illustrates an initial lane alignment (ILA) sequence that may be used for transferring data between the data converters and the logic device in the circuit system of FIG. 4, according to an embodiment.

FIG. 5 illustrates an initial lane alignment (ILA) sequence that may be used for transferring data between the data converters 411-414 and the logic device 401 in the circuit system 400 of FIG. 4, according to an embodiment. The ILA sequence disclosed herein with respect to FIG. 5 may, for example, conform to the specifications of the JESD204B standard. FIG. 5 shows a sequence of bits containing 4 multi-frames that function as an initial lane alignment (ILA) sequence. Each of the 4 multi-frames in the ILA sequence shown in FIG. 5 includes a k number of frames, where k is a positive integer greater than 1. Each of these 4 multi-frames within the ILA sequence begins with a start of subsequence character R and ends with a lane alignment character A. The characters R and A define the boundaries of each of the 4 multi-frames in the ILA sequence. In the JESD204B standard, A and R are alignment markers that are used to determine the data and time alignment and to adjust the depth of an elastic buffer that adds link latency to the data path.

The JESD204B standard may implement deterministic latency of the links between the data converters and the logic device with a three step technique that utilizes synchronization signal SYSREF. In step 1, signal SYSREF is sent to all of the devices to align internal clock edges to common signal edges across all devices, as shown in FIG. 4. In step 2, the transmitter (TX) encodes and transmits in-band codes (e.g., ILA—Initial Lane Alignment sequence) that encode timing information, as shown in FIG. 5. This step 2 is executed as part of the link establishment. In step 3, the receiver (RX) analyzes the start of the ILA sequence (e.g., using the A and R alignment markers) and compares the start of the ILA sequence to the receiver's timestamp generated by the receiver's SYSREF signal. Based on this information, the receiver instructs the elastic buffer to delay the data to achieve a predetermined latency for the link.

This 3-step technique of the JESD204B standard can be used to provide deterministic latency for the link for each of the directions of data flow in system 400 independently. Because this technique of the JESD204B standard is only used for the link latency, the data converter front-end is constrained to being deterministic and fully synchronous. This constraint implies specific architectural considerations for each data converter that force the design of the system to be fully synchronous. In addition, clock domain transfers between the data converters and the logic device that can enable ultra-wide band samplers with orders of magnitude higher sampling rates may be prevented by (or complicated by) this constraint. The architectures of some high-speed sampling data converters can be simplified if the hard deterministic latency specifications for the data converters are removed. Therefore, it would be desirable to eliminate the hard deterministic latency constraint for the design of the data converters (i.e., ADCs 411-412 and DACs 413-414) in circuit system 400. In some embodiments, the synchronization signal SYSREF has a deterministic latency on the transmit side and the receive side of the system to serve as an alignment indicator for the start of the transmit data relative to the arrival of the receive data.

According to some embodiments disclosed herein, a system comprising one or more data converters and a logic device does not need the constraint that the one or more data converters have hard deterministic latency. Instead, the latencies of the data converters are measured before data transfers are performed in the corresponding data paths. Each of the measured latencies is then used to add latency to a data path to provide deterministic latency to the data path. These embodiments may, for example, cause a timing signal (e.g., generated based on the synchronization signal SYSREF) to incur the same latency uncertainty as a data path in the system. Two or more of the data converters in the system (e.g., the ADCs and the DACs) may be designed and integrated into the same integrated circuit die (e.g., a silicon IC die) or in separate integrated circuit dies.

A trend in the design and manufacture of circuit systems is related to the disaggregation of integration circuits (ICs) to multiple functional chiplets (i.e., small integrated circuits) that are implemented in different manufacturing processes, rather than in a single monolithic IC die. This trend is one reason for new definitions of interfaces, such as the JESD204B standard, that are not specifically designed to provide deterministic latency in data converters. To address this problem, some embodiments disclosed herein may provide deterministic latency in a data path having a data converter that does not have hard deterministic latency and that is operated according to any standard interface, such as the JESD204B standard.

According to some embodiments, one or more data converters may generate timing bits in a data path based on a timing signal. These timing bits follow the same path as data through the data converter, so that the timing bits incur the same latency uncertainty as the data. In these embodiments, the data converters do not need to be designed to have hard deterministic latency in the data path. Instead, the latency of the data path is set to be deterministic by measuring the latency of the data path using the timing bits and adding latency to the data path based on the measured latency, so that the data converter does not need to be designed with hard deterministic latency.

Figure 6:
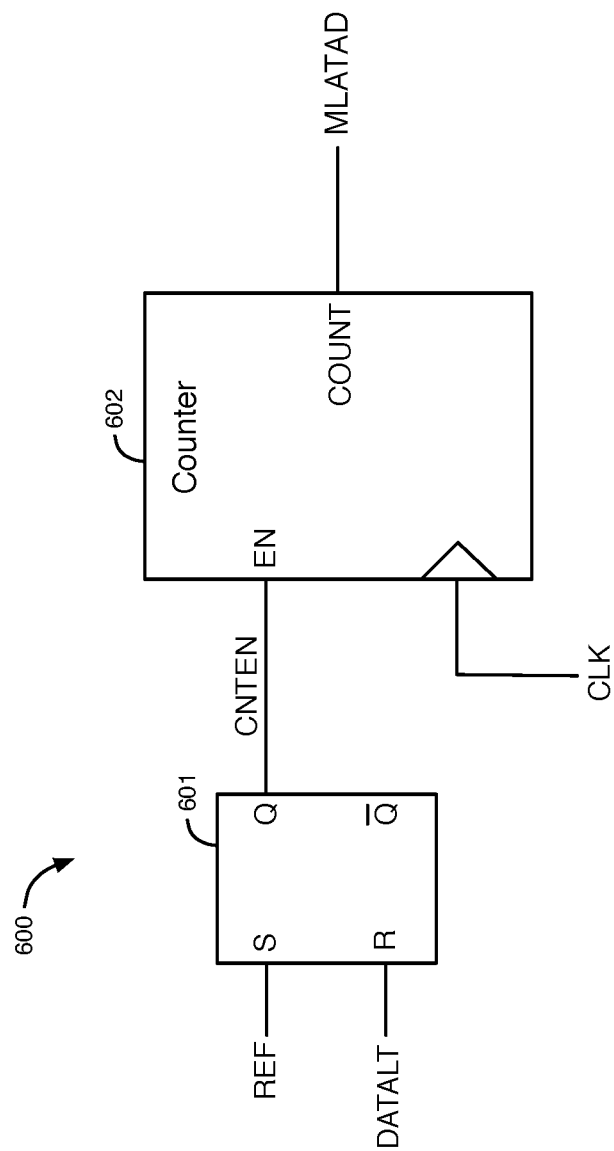
FIG. 6 illustrates an example of a measurement circuit that measures the latency of a data path that includes an ADC circuit using a timing signal, according to an embodiment.
Figure 7:
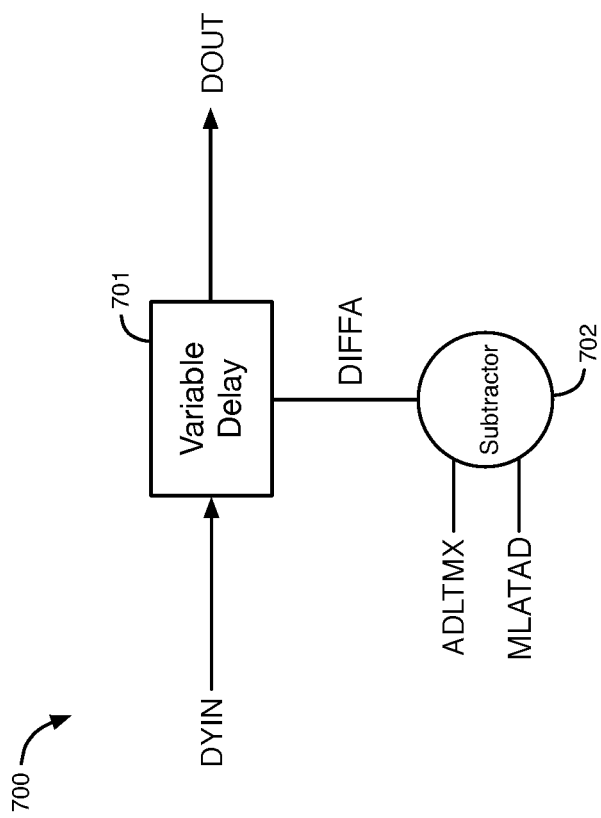
FIG. 7 illustrates an example of a variable latency circuit that can increase the latency of the data path that includes the ADC circuit to the maximum latency of the ADC data path, according to an embodiment.

According to some embodiments disclosed herein with respect to FIGS. 6-7, a circuit system measures the latency of a data path that includes an analog-to-digital converter (ADC) circuit and then adds latency to that data path that is based on the measured latency. The data path that includes the ADC circuit is also referred to herein as the ADC data path. In these embodiments, the ADC circuit and the ADC data path may be designed without the constraint of having hard deterministic latency by design. In these embodiments, a timing signal that incurs the same latency uncertainty as the ADC data path may be used to measure the latency of the ADC data path. The timing signal may incur any data capture uncertainty in the ADC data path. A measurement circuit measures the latency of the ADC data path using the timing signal. A variable latency circuit then adds latency to the ADC data path based on the measured latency to cause the ADC data path to have deterministic latency. The measurement circuit can be implemented, for example, using a digital counter circuit. These embodiments may be used for the purpose of aligning data at multiple input or output ports of the ADC circuit.

FIG. 6 illustrates an example of a measurement circuit 600 that measures the latency of a data path that includes an ADC circuit using a timing signal, according to an embodiment. The measurement circuit 600 of FIG. 6 may, for example, be part of the logic device 401 of FIG. 4 or in another IC in circuit system 400. The measurement circuit 600 of FIG. 6 includes a set-reset (SR) flip-flop circuit 601 and a digital counter circuit 602. A reference timing signal REF is provided to the set (S) input of flip-flop circuit 601. The REF signal has no uncertainty with respect to the latency of the REF signal from the source of the REF signal to the S input of flip-flop 601. The REF signal can be any signal that has a fixed timing relationship to the SYSREF signal of FIG. 4. In an exemplary implementation of measurement circuit 600, the REF signal may be the SYSREF signal that is provided to ADC circuit 411 and/or 412.

A second timing signal DATALT is provided to the reset input (R) of flip-flop circuit 601. The second timing signal DATALT is a timing signal that incurs the same latency uncertainty as data transmitted through the data path that includes the ADC circuit (e.g., ADC circuit 411 or 412). The DATALT signal incurs any data capture uncertainty in the ADC data path.

As an example, the ADC circuit 411 or 412 may include a first-in-first-out (FIFO) buffer circuit that stores the input data A1 or A2 and provides the stored input data as the output data D1 or D2, respectively. The FIFO buffer circuit in the ADC circuit 411/412 may generate one or more timing bits based on the SYSREF signal and then add the timing bits to the output data D1/D2. The one or more timing bits added to the output data D1/D2 are indicative of timing information from the SYSREF signal. The one or more timing bits may, for example, be added to the initial lane alignment (ILA) sequence shown in FIG. 5. The one or more timing bits generated based on the SYSREF signal incur the same latency as the data D1/D2 incurs propagating from the FIFO buffer circuit in the ADC circuit 411/412 through the ADC data path to the logic device 401. The one or more timing bits are provided through the same ADC data path as the data D1/D2 to the R input of the flip-flop circuit 601 as signal DATALT.

Flip-flop circuit 601 generates an output signal CNTEN stored at its Q output. The voltage of signal CNTEN is based on input signals REF and DATALT. Flip-flop circuit 601 may, for example, generate a logic high pulse in signal CNTEN that begins when flip-flop 601 receives a rising edge in signal REF and that ends when flip-flop 601 receives a rising edge in the DATALT signal. In this example, the delay between the rising edges in signals REF and DATALT indicates the latency of the data path that includes the ADC circuit 411/412. Thus, in this example, flip-flop circuit 601 causes the duration of the logic high pulse in the CNTEN signal to indicate the delay between rising edges in signals REF and DATALT. Thus, the duration of the logic high pulse in signal CNTEN indicates the latency of the data path that includes the ADC circuit 411 or 412.

Signal CNTEN is provided to the enable input EN of counter circuit 602. A periodic clock signal CLK is provided to the clock input of counter circuit 602. Counter circuit 602 generates a set of digital count signals MLATAD at its outputs. Counter circuit 602 causes the value of the count signals MLATAD to indicate the measured latency of the data path that includes the ADC circuit 411 or 412. While the CNTEN signal is in a logic high state, counter circuit 602 increases the value of the digital count signals MLATAD by one in response to each rising edge in clock signal CLK. While the CNTEN signal is in a logic low state, counter circuit 602 maintains the value of the digital count signals MLATAD constant. As a result, counter circuit 602 causes the value of the digital count signals MLATAD to indicate the duration of the logic high pulse in the CNTEN signal. Because flip-flop circuit 601 causes the logic high pulse in the CNTEN signal to indicate the latency of the data path that includes the ADC circuit 411 or 412, counter circuit 602 causes the value of the digital count signals MLATAD to indicate the measured latency of the data path that includes the ADC circuit 411 or 412. The data path that includes the ADC circuit may, for example, be the data path from a FIFO buffer circuit in the ADC circuit 411/412 to a receiver circuit in the logic device 401.

After the measurement circuit 600 has measured the latency of the data path that includes the ADC circuit 411/412, the latency of the data path that includes the ADC circuit 411/412 can be increased to a maximum latency of the data path that includes the ADC 411/412. The maximum latency of the data path that includes the ADC circuit 411/412 can be estimated based on the circuit design or may be measured by testing. FIG. 7 illustrates an example of a variable latency circuit 700 that can increase the latency of the data path that includes the ADC circuit to the maximum latency of the ADC data path, according to an embodiment. The variable latency circuit 700 of FIG. 7 includes a variable delay circuit 701 and a subtractor circuit 702. The variable latency circuit 700 of FIG. 7 may, for example, be part of the logic device 401 of FIG. 4 or in another IC in circuit system 400.

The count signals MLATAD are provided to first inputs of the subtractor circuit 702. Signals MLATAD are generated by the measurement circuit 600 of FIG. 6. The value of signals MLATAD indicates the measured latency of the data path that includes the ADC circuit 411 or 412. A second set of digital signals ADLTMX are provided to second inputs of the subtractor circuit 702. The value of the digital signals ADLTMX indicates the maximum latency of the data path that includes the ADC circuit 411 or 412. Subtractor circuit 702 is a logic circuit (e.g., a combinatorial logic circuit) that performs the subtraction of two numbers. Subtractor circuit 702 subtracts the value of signals MLATAD from the value of signals ADLTMX to generate a difference in the value of the digital output signals DIFFA of subtractor circuit 702. Subtractor circuit 702 causes the value of signals DIFFA to equal the value of signals ADLTMX minus the value of signals MLATAD (DIFFA=ADLTMX−MLATAD).

Signals DIFFA are provided to control inputs of the variable delay circuit 701. Variable delay circuit 701 is coupled in the data path that includes the ADC circuit 411 or 412. The data output signals D1 or D2 of one of the ADC circuits 411 or 412 are provided through conductors to inputs of the variable delay circuit 701 as data input signals DYIN. In some embodiments, logic device 401 may include 2 variable latency circuits 700. One of the variable latency circuits 700 receives the output data signals D1 of ADC circuit 411 as the data input signals DYIN, and the other variable latency circuit 700 receives the output data signals D2 of ADC circuit 412 as the data input signals DYIN.

Variable delay circuit 701 provides the data indicated by the data input signals DYIN to outputs of the variable delay circuit 701 as delayed data output signals DOUT. Variable delay circuit 701 adds delay to the data indicated by the delayed data output signals DOUT relative to the same data indicated by the data input signals DYIN. Variable delay circuit 701 sets the delay provided to the data indicated by the data output signals DOUT relative to the same data indicated by the data input signals DYIN based on the value of signals DIFFA. Variable delay circuit 701 varies the delay provided to the data indicated by the data output signals DOUT relative to the same data indicated by the data input signals DYIN based on changes in the value of signals DIFFA. In response to the value of signals DIFFA indicating the difference between the maximum latency of the data path that includes the ADC circuit (as indicated by signals ADLTMX) and the measured latency of the data path that includes the ADC circuit (as indicated by signals MLATAD), variable delay circuit 701 increases the delay provided to the data indicated by data output signals DOUT to the maximum latency of the data path that includes the ADC circuit 411/412. As a result, the latency of the data path that includes the ADC circuit 411/412 and the variable latency circuit 700 is deterministic and is set to the maximum latency of the ADC data path.

An advantage of the technique of FIGS. 6-7 is that new implementations of the ADC circuits 411/412 can be made without having the requirement of hard deterministic latency by design. Instead, the latency of the ADC data path is measured at a system level, including the latency of the ADC circuit and the interconnect between the ADC circuit and the logic device 401, as described above.

According to other embodiments disclosed herein, the latency of a data path that includes a DAC circuit is tuned to be deterministic by measuring the latency of a data path that includes the DAC circuit and an ADC circuit. In these embodiments, the DAC circuit does not have to be designed to have hard deterministic latency. Instead, a data path that includes the DAC circuit may be designed without the constraint of having hard deterministic latency. Releasing this constraint allows the implementation of higher performing and more economical data converters, including the DAC circuit.

In some embodiments, a loopback path is coupled through the DAC data path and the ADC data path for purpose of determining the latency of the DAC data path. The data path that includes the DAC circuit is also referred to herein as the DAC data path. The loopback path through the DAC circuit and the ADC circuit may be used to measure the latency of the DAC data path and then tune the DAC data path to have deterministic latency. This technique may be more practical and easier to implement than enforcing hard deterministic latency in the DAC circuit during the design phase. In addition, this technique can be applied to discrete ADC and DAC devices (in different IC dies) that do not have hard deterministic latency, with a loopback path in the system through the DAC and ADC devices.

Figure 8:
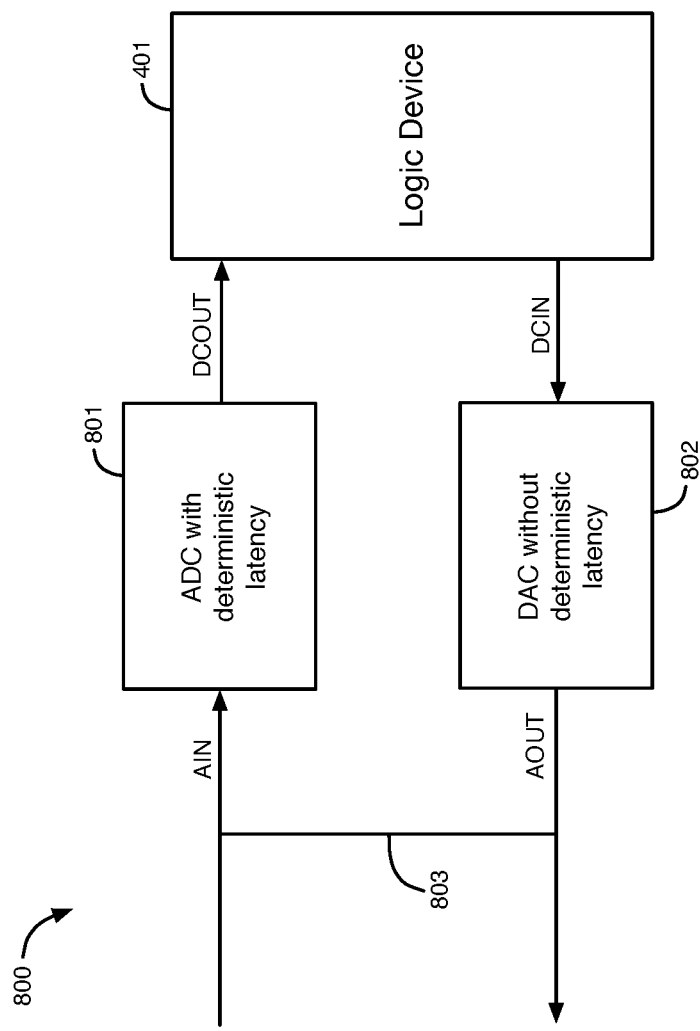
FIG. 8 illustrates an example of a loopback path through a DAC circuit and an ADC circuit that is used to measure the latency of the DAC data path and tune the DAC data path to have deterministic latency, according to an embodiment.

FIG. 8 illustrates an example of a loopback path 800 through a DAC circuit and an ADC circuit that is used to measure the latency of the DAC data path and tune the DAC data path to have deterministic latency, according to an embodiment. The loopback path 800 of FIG. 8 includes the logic device 401 of FIG. 4, analog-to-digital converter (ADC) circuit 801, digital-to-analog converter (DAC) circuit 802, and a loopback connection 803. ADC circuit 801 may be, for example, ADC circuit 411 or 412 of FIG. 4. DAC circuit 802 may be, for example, the DAC circuit 413 or 414 of FIG. 4. The loopback connection 803 includes one or more conductors (e.g., wires) that are coupled between one or more outputs of DAC circuit 802 and one or more inputs of ADC circuit 801. The ADC circuit 801 and DAC circuit 802 may be in the same IC die or package or in different IC dies/packages.

In the embodiment of FIG. 8, the data path that includes ADC circuit 801 is tuned to have a deterministic latency using the circuitry and techniques disclosed herein with respect to FIGS. 6-7 before the latency of the DAC data path is measured using loopback path 800. The latency of the DAC data path may then be measured, for example, by generating a calibration pattern during a test mode. The logic device 401 generates a digital calibration pattern that is provided to the DAC data path is this exemplary embodiment. The digital calibration pattern is provided from the logic device 401 through one or more conductors to one or more inputs of DAC circuit 802 as one or more digital signals DCIN. DAC circuit 802 converts the digital calibration pattern indicated by signal(s) DCIN to an analog calibration pattern indicated by analog signals AOUT at one or more outputs of DAC circuit 802. The analog signals AOUT are provided through the conductors of the loopback connection 803 to one or more inputs of ADC circuit 801 as analog signals AIN. Analog signals AIN indicate the same analog calibration pattern as analog signals AOUT. ADC circuit 801 converts the analog calibration pattern indicated by analog signals AIN to a digital calibration pattern indicated by digital output signals DCOUT at one or more outputs of ADC circuit 801. Digital signals DCOUT are provided through conductors in path 800 to inputs of logic device 401.

As the calibration pattern generated by the logic device 401 propagates through the DAC data path including the loopback connection 803 and the ADC data path, the calibration pattern incurs the same latency as data propagating through these data paths. The calibration pattern incurs any latency uncertainty that exists in the DAC data path. Because the ADC data path has a known and deterministic latency by design or by applying the techniques disclosed herein with respect to FIGS. 6-7, any latency uncertainty in the output calibration pattern in signals DCOUT is caused by latency uncertainty in the DAC data path, including loopback connection 803.

Measurement circuitry in logic device 401 performs a measurement of the round-trip latency through the loopback path 800 of FIG. 8 based on the delay between the input and output calibration patterns in signals DCIN and DCOUT, respectively. The measurement circuitry can perform the measurement of the round-trip latency through the loopback path 800 using any suitable technique. For example, the logic device 401 may generate the calibration pattern as a calibration signal DCIN having a digital ramp. In this example, the latency of the loopback path 800 is determined based on the time for a predefined value indicating the digital ramp to propagate from logic device 401 in input signal DCIN through the loopback path 800 to logic device 401 as output signal DCOUT.

As another example, the logic device 401 may generate the calibration pattern as an impulse in the calibration signal DCIN. In this example, the latency of the loopback path 800 is determined based on the time for one or more waveforms indicating the impulse to propagate from logic device 401 in input signal DCIN through the loopback path 800 back to logic device 401 as output signal DCOUT. The impulse may be detected at the output of the loopback path 800 based on signal DCOUT passing a predefined threshold.

As yet another example, the logic device 401 may generate the calibration pattern as a tone or pseudo-random signal in signal DCIN. In this example, the latency of the loopback path 800 is determined based on the logic device 401 detecting a maximum correlation point in time shift in signal DCOUT. The latency of the loopback path 800 in this example is the time between when logic device 401 generates the tone or pseudo-random signal in signal DCIN and when the logic device 401 detects the maximum correlation point in signal DCOUT indicative of the tone or pseudo-random signal.

Figure 9:
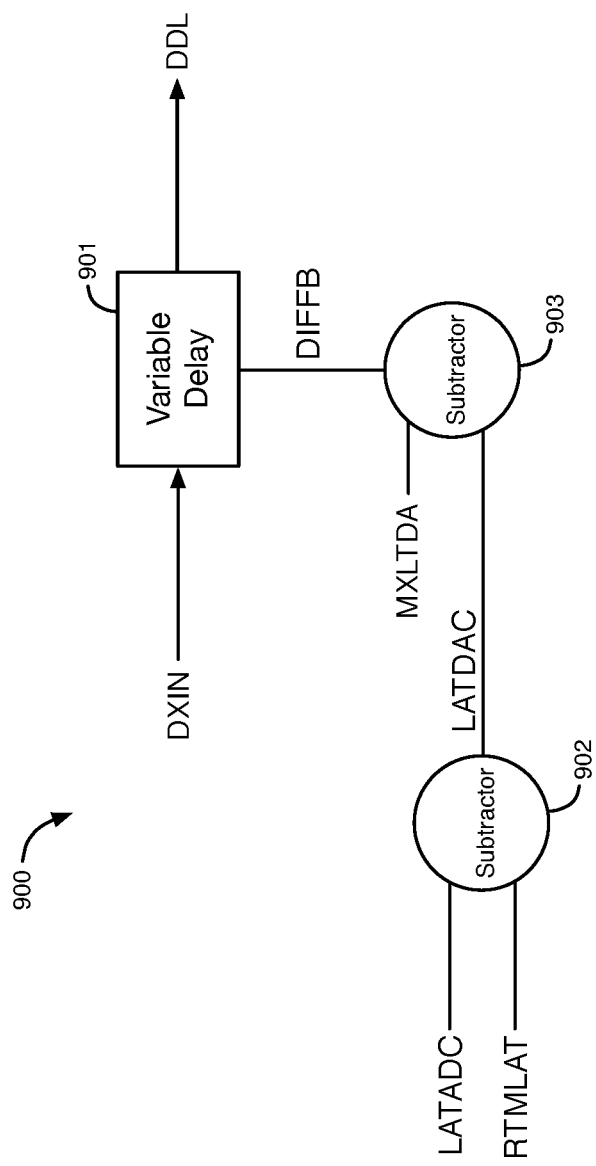
FIG. 9 illustrates an example of a variable latency circuit that can increase the latency of the data path that includes the DAC circuit to the maximum latency of the DAC data path, according to an embodiment.

The latency of the DAC data path can be determined by subtracting the known deterministic latency of the ADC data path from the round-trip latency measured using the loopback path 800 and the measurement techniques disclosed herein with respect to FIG. 8. FIG. 9 illustrates an example of a variable latency circuit 900 that can increase the latency of the data path that includes the DAC circuit 802 to the maximum latency of the DAC data path, according to an embodiment. The variable latency circuit 900 of FIG. 9 may, for example, be part of the logic device 401 of FIG. 4 or in another IC in circuit system 400. The variable latency circuit 900 of FIG. 9 includes a variable delay circuit 901, a first subtractor circuit 902, and a second subtractor circuit 903. Subtractor circuits 902-903 function as a measurement circuit, as described below.

A first set of digital signals LATADC are provided to first inputs of subtractor circuit 902, and a second set of digital signals RTMLAT are provided to second inputs of subtractor circuit 902. Signals LATADC indicate the deterministic latency of the ADC data path that includes ADC circuit 801. As an example, signals LATADC may have the same value as signals ADLTMX. According to the techniques disclosed herein with respect to FIG. 7, variable latency circuit 700 adds the maximum latency to the ADC data path, and signals ADLTMX indicate the maximum latency of the ADC data path. In this example, the value of signals LATADC indicates the maximum latency of the ADC data path.

The value of signals RTMLAT indicates the round-trip latency of the loopback path 800 that has been measured according to the techniques disclosed herein with respect to FIG. 8. Subtractor circuits 902 and 903 are logic circuits (e.g., combinatorial logic circuits) that each perform the subtraction of two numbers. Subtractor circuit 902 subtracts the value of signals LATADC from the value of signals RTMLAT to generate a difference that is indicated by the value of digital output signals LATDAC. Subtractor circuit 902 causes the value of its output signals LATDAC to equal the value of signals RTMLAT minus the value of signals LATADC (i.e., LATDAC=RTMLAT−LATADC). Signals LATDAC indicate the latency of the DAC data path that includes DAC circuit 802 within the loopback path 800 of FIG. 8.

The digital output signals LATDAC are provided to first inputs of subtractor circuit 903. Another set of digital signals MXLTDA are provided to second inputs of subtractor circuit 903. The value of the digital signals MXLTDA equals the maximum latency of the DAC data path in the loopback path 800. The maximum latency of the DAC data path that includes DAC circuit 802 can be estimated based on the circuit design or may be measured by testing. Subtractor circuit 903 subtracts the value of signals LATDAC from the value of signals MXLTDA to generate a difference that is indicated by the value of digital output signals DIFFB. Subtractor circuit 903 causes the value of its output signals DIFFB to equal the value of signals MXLTDA minus the value of signals LATDAC (i.e., DIFFB=MXLTDA−LATDAC).

Signals DIFFB are provided to control inputs of variable delay circuit 901. Variable delay circuit 901 is coupled in the data path that includes the DAC circuit 802. Data input signals DXIN are provided to inputs of the variable delay circuit 901. Data signals DXIN may be generated by circuitry in logic device 401. Variable delay circuit 901 provides the data indicated by the data input signals DXIN to outputs of the variable delay circuit 901 as delayed data output signals DDL. Data output signals DDL are provided to inputs of DAC circuit 802. As an example, data signals DDL may be provided to one of the DAC circuits 413 or 414 in circuit system 400 as data signals D3 or D4, respectively. In some embodiments, logic device 401 may include 2 variable latency circuits 900. The first variable latency circuit 900 provides its data output signals DDL to DAC circuit 413 as data signals D3, and the second variable latency circuit 900 provides its data output signals DDL to DAC circuit 414 as data signals D4.

Variable delay circuit 901 adds delay to the data indicated by the data output signals DDL relative to the same data indicated by the data input signals DXIN. Variable delay circuit 901 sets the delay provided to the data indicated by data output signals DDL relative to the same data indicated by the data input signals DXIN based on the value of signals DIFFB. Variable delay circuit 901 varies the delay provided to the data indicated by the data output signals DDL relative to the same data indicated by the data input signals DXIN based on changes in the value of signals DIFFB. In response to the value of signals DIFFB indicating the difference between the measured latency of the DAC data path in loopback path 800 (indicated by signals LATDAC) and the maximum latency of the DAC data path in loopback path 800 (indicated by signals MXLTDA), variable delay circuit 901 increases the delay provided to the data indicated by data signals DDL to the maximum latency of the DAC data path in loopback path 800. As a result, the latency of the DAC data path in loopback path 800 is deterministic and is set to its maximum latency. The latency of the DAC data path is then set to a known and deterministic value that equals the maximum latency of the DAC data path.

In some implementations, the measurement of the latency of the DAC data path and/or the ADC data path using the techniques of FIGS. 4-9 may change between instances of the devices in the system or between start-up conditions of the devices in the system. In these implementations, the latency of the DAC and ADC data paths can be remeasured for each instance of the system or for each set of start-up conditions of the system.

Figure 10:
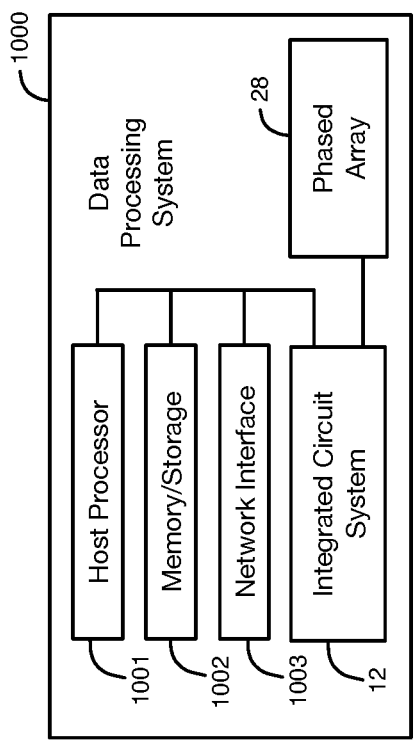
FIG. 10 illustrates an example of a data processing system that includes the integrated circuit system of FIG. 1, according to an embodiment.

The integrated circuit system 12 of FIGS. 1-3 may be a data processing system or a component included in a data processing system. For example, the integrated circuit system 12 may be a component of a data processing system. FIG. 10 illustrates an example of a data processing system 1000 that includes the integrated circuit system 12, according to an embodiment. The data processing system 1000 may include a host processor 1001 (e.g., a central-processing unit (CPU)), memory and/or storage circuitry 1002, and a network interface 1003. The data processing system 1000 may include more or fewer components (e.g., an electronic display, user interface structures, application specific integrated circuits (ASICs)). The host processor 1001 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 1000 (e.g., to perform encryption, decryption, machine learning, video processing, voice recognition, image recognition, data compression, database search ranking, bioinformatics, network security pattern identification, spatial navigation, sensing or transmitting using a phased array 28, or the like). The memory and/or storage circuitry 1002 may include random access memory (RAM), read-only memory (ROM), one or more hard drives, flash memory, or the like. The memory and/or storage circuitry 1002 may hold data to be processed by the data processing system 1000. In some cases, the memory and/or storage circuitry 1002 may also store configuration programs (bitstreams) for programming the integrated circuit system 12. The network interface 1003 may allow the data processing system 1000 to communicate with other electronic devices. The data processing system 1000 may include several different packages or may be contained within a single package on a single package substrate. In some cases, the phased array 28 may be a component of the network interface 1003 or may be used by the network interface 1003 to receive or transmit signals in particular spatial directions.

In one example, the data processing system 1000 may be part of a data center that processes a variety of different requests. For instance, the data processing system 1000 may receive a data processing request via the network interface 1003 to perform encryption, decryption, machine learning, video processing, voice recognition, image recognition, data compression, database search ranking, bioinformatics, network security pattern identification, spatial navigation, digital signal processing, or some other specialized task. Some or all of the components of the data processing system 1000 may be virtual machine components running on physical circuitry (e.g., managed by one or more hypervisors or virtual machine managers). Whether physical components or virtual machine components, the various components of the data processing system 1000 may be located in the same location or different locations (e.g., on different boards, in different rooms, or at different geographic locations). Indeed, the data processing system 1000 may be accessible via a computing service provider (CSP) that may provide an interface to customers to use the data processing system 1000 (e.g., to run programs and/or perform acceleration tasks) in a cloud computing environment.

The following examples pertain to further embodiments.

Example 1 is a circuit system comprising: an analog-to-digital converter circuit; a digital-to-analog converter circuit coupled to the analog-to-digital converter circuit; and a variable latency circuit coupled to a first data path comprising the digital-to-analog converter circuit, wherein the variable latency circuit generates a deterministic latency in an output signal that is based on a measured latency of the first data path.

In Example 2, the circuit system of Example 1 may optionally include wherein the variable latency circuit generates the deterministic latency in the output signal based on a difference between a maximum latency of the first data path and the measured latency of the first data path.

In Example 3, the circuit system of any one of Examples 1-2 may optionally include wherein the variable latency circuit determines the measured latency of the first data path based on a difference between a latency of a second data path and a latency of a third data path, wherein the second data path comprises the analog-to-digital converter circuit, and wherein the third data path comprises the first data path and the second data path.

In Example 4, the circuit system of Example 3 may optionally further comprise: a logic device that measures the latency of the third data path based on a difference in timing between a calibration pattern transmitted to the digital-to-analog converter circuit and an output signal generated by the analog-to-digital converter circuit based on the calibration pattern.

In Example 5, the circuit system of Example 1 may optionally include wherein the variable latency circuit comprises: a first subtractor circuit that subtracts the measured latency of the first data path from a maximum latency of the first data path to generate a difference; and a variable delay circuit that delays the output signal relative to an input signal based on the difference.

In Example 6, the circuit system of Example 5 may optionally include wherein the variable latency circuit further comprises: a second subtractor circuit that subtracts a latency of a second data path from a latency of a third data path to generate the measured latency of the first data path, wherein the third data path comprises the digital-to-analog converter circuit, a loopback connection, and the analog-to-digital converter circuit, and wherein the second data path comprises the analog-to-digital converter circuit; and a measurement circuit that measures the latency of the second data path based on a timing difference between a reference timing signal and a signal that incurs a same latency as data propagating through the second data path.

In Example 7, the circuit system of any one of Examples 1-2 may optionally include wherein the variable latency circuit measures the measured latency of the first data path based on a latency of a second data path that comprises the digital-to-analog converter circuit and the analog-to-digital converter circuit.

In Example 8, the circuit system of any one of Examples 1-7 may optionally include wherein the variable latency circuit causes the deterministic latency in the output signal to equal a maximum latency of the first data path based on the measured latency of the first data path.

In Example 9, the circuit system of any one of Examples 1-8 may optionally include wherein an output of the variable latency circuit is coupled to an input of the digital-to-analog converter circuit in the first data path, and wherein the variable latency circuit comprises a variable delay circuit that delays the output signal at the output relative to an input signal.

Example 10 is a circuit system comprising: an analog-to-digital converter circuit; a measurement circuit that generates a measurement of a latency of a first data path that comprises the analog-to-digital converter circuit; and a variable latency circuit coupled to the first data path, wherein the variable latency circuit generates a delayed signal that is delayed relative to an input signal, and wherein the variable latency circuit causes the delayed signal to have a deterministic latency that is based on the measurement of the latency of the first data path.

In Example 11, the circuit system of Example 10 may optionally include wherein the variable latency circuit causes the delayed signal to have the deterministic latency based on a difference between a maximum latency of the first data path and the measurement of the latency of the first data path.

In Example 12, the circuit system of Example 11 may optionally include wherein the variable latency circuit comprises: a subtractor circuit that subtracts the measurement of the latency of the first data path from the maximum latency of the first data path to generate the difference; and a variable delay circuit that delays the delayed signal relative to the input signal based on the difference.

In Example 13, the circuit system of Example 12 may optionally include wherein the variable latency circuit receives the input signal from an output of the analog-to-digital converter circuit, and wherein the variable latency circuit causes the deterministic latency in the delayed signal to equal the maximum latency of the first data path based on the difference.

In Example 14, the circuit system of any one of Examples 10-13 may optionally include wherein the measurement circuit comprises: a flip-flop circuit that generates a stored signal indicating a timing difference between a reference timing signal and a signal that incurs a same latency as data propagating through the first data path; and a counter circuit that generates at least one output signal indicating the measurement of the latency of the first data path based on the timing difference indicated by the stored signal.

In Example 15, the circuit system of any one of Examples 10-14 may optionally further comprise: a digital-to-analog converter circuit coupled to the analog-to-digital converter circuit; and an additional variable latency circuit coupled to a second data path that comprises the digital-to-analog converter circuit, wherein the additional variable latency circuit generates a deterministic latency in an output signal that is based on a latency of the second data path, and wherein the additional variable latency circuit determines the latency of the second data path based on the measurement of the latency of the first data path.

In Example 16, the circuit system of Example 15 may optionally include wherein the additional variable latency circuit determines the latency of the second data path based on the measurement of the latency of the first data path and based on a measurement of a latency of a third data path that comprises the digital-to-analog converter circuit and the analog-to-digital converter circuit.

Example 17 is a method for generating a deterministic latency for a first data path that comprises a digital-to-analog converter circuit, the method comprising: measuring a latency of a second data path through the first data path and a third data path, wherein the third data path comprises an analog-to-digital converter circuit; determining a latency of the first data path using a variable latency circuit based on a difference between the latency of the second data path and a latency of the third data path; and generating a deterministic latency in an output signal of the variable latency circuit based on a difference between a maximum latency of the first data path and the latency of the first data path.

In Example 18, the method of Example 17 may optionally include wherein measuring the latency of the second data path comprises measuring the latency of the second data path based on a difference in timing between a calibration pattern transmitted to the digital-to-analog converter circuit and an output signal of the analog-to-digital converter circuit generated based on the calibration pattern having propagated through the second data path.

In Example 19, the method of any one of Examples 17-18 may optionally include wherein generating the deterministic latency in the output signal of the variable latency circuit comprises: delaying the output signal of the variable latency circuit relative to an input signal; increasing the latency of the output signal of the variable latency circuit to the maximum latency of the first data path in response to the difference between the maximum latency of the first data path and the latency of the first data path; and providing the output signal of the variable latency circuit to an input of the digital-to-analog converter circuit.

In Example 20, the method of any one of Examples 17-19 may optionally further comprise: measuring the latency of the third data path using a measurement circuit based on a timing difference between a reference timing signal and a signal that incurs a same latency as data propagating through the third data path.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is intended to cover all modifications, equivalents, and alternatives falling within the spirit and scope of the disclosure as defined by the following appended claims. Moreover, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A circuit system comprising:
an analog-to-digital converter circuit;
a digital-to-analog converter circuit coupled to the analog-to-digital converter circuit; and
a variable latency circuit coupled to a first data path comprising the digital-to-analog converter circuit, wherein the variable latency circuit generates a deterministic latency in a first output signal that is based on a first difference between a maximum latency of the first data path and a measured latency of the first data path.

2. The circuit system of claim 1, wherein the first output signal is provided to the digital-to-analog converter circuit.

3. The circuit system of claim 1, wherein the variable latency circuit determines the measured latency of the first data path based on a second difference between a fourth latency of a second data path and a fifth latency of a third data path, wherein the second data path comprises the analog-to-digital converter circuit, and wherein the third data path comprises the first data path and the second data path.

4. The circuit system of claim 3 further comprising:
a logic device that measures the fifth latency of the third data path based on a third difference in timing between a calibration pattern transmitted to the digital-to-analog converter circuit and a second output signal generated by the analog-to-digital converter circuit based on the calibration pattern.

5. The circuit system of claim 1, wherein the variable latency circuit comprises:
a first subtractor circuit that subtracts the measured latency of the first data path from the maximum latency of the first data path to generate the first difference; and
a variable delay circuit that delays the first output signal relative to an input signal based on the first difference.

6. The circuit system of claim 5, wherein the variable latency circuit further comprises:
a second subtractor circuit that subtracts a fourth latency of a second data path from a fifth latency of a third data path to generate the measured latency of the first data path, wherein the third data path comprises the digital-to-analog converter circuit, a loopback connection, and the analog-to-digital converter circuit, and wherein the second data path comprises the analog-to-digital converter circuit; and
a measurement circuit that measures the fourth latency of the second data path based on a timing difference between a reference timing signal and a second timing signal that incurs a same latency as data propagating through the second data path.

7. The circuit system of claim 1, wherein the variable latency circuit measures the measured latency of the first data path based on a fourth latency of a second data path that comprises the digital-to-analog converter circuit and the analog-to-digital converter circuit.

8. The circuit system of claim 1, wherein the variable latency circuit causes the deterministic latency in the first output signal to equal the maximum latency of the first data path based on the measured latency of the first data path.

9. The circuit system of claim 1, wherein an output of the variable latency circuit is coupled to an input of the digital-to-analog converter circuit in the first data path, and wherein the variable latency circuit comprises a variable delay circuit that delays the first output signal at the output relative to an input signal.

10. A circuit system comprising:
an analog-to-digital converter circuit;
a measurement circuit that generates a first measurement of a first latency of a first data path that comprises the analog-to-digital converter circuit; and
a first variable latency circuit coupled to the first data path, wherein the first variable latency circuit generates a delayed signal that is delayed relative to an input signal, and wherein the first variable latency circuit causes the delayed signal to have a first deterministic latency that is based on a difference between a maximum latency of the first data path and the first measurement of the first latency of the first data path.

11. The circuit system of claim 10, wherein the first variable latency circuit receives the input signal from the analog-to-digital converter circuit.

12. The circuit system of claim 10, wherein the first variable latency circuit comprises:
a subtractor circuit that subtracts the first measurement of the first latency of the first data path from the maximum latency of the first data path to generate the difference; and
a variable delay circuit that delays the delayed signal relative to the input signal based on the difference.

13. The circuit system of claim 12, wherein the first variable latency circuit receives the input signal from an output of the analog-to-digital converter circuit, and wherein the first variable latency circuit causes the first deterministic latency in the delayed signal to equal the maximum latency of the first data path based on the difference.

14. The circuit system of claim 10, wherein the measurement circuit comprises:
a flip-flop circuit that generates a stored signal indicating a timing difference between a reference timing signal and a second timing signal that incurs a same latency as data propagating through the first data path; and
a counter circuit that generates at least one output signal indicating the first measurement of the first latency of the first data path based on the timing difference indicated by the stored signal.

15. The circuit system of claim 10 further comprising:
a digital-to-analog converter circuit coupled to the analog-to-digital converter circuit; and
an additional variable latency circuit coupled to a second data path that comprises the digital-to-analog converter circuit, wherein the additional variable latency circuit generates a second deterministic latency in an output signal that is based on a second latency of the second data path, and wherein the additional variable latency circuit determines the second latency of the second data path based on the first measurement of the first latency of the first data path.

16. The circuit system of claim 15, wherein the additional variable latency circuit determines the second latency of the second data path based on the first measurement of the first latency of the first data path and based on a second measurement of a third latency of a third data path that comprises the digital-to-analog converter circuit and the analog-to-digital converter circuit.

17. A method for generating a deterministic latency for a first data path that comprises a digital-to-analog converter circuit, the method comprising:
measuring a second latency of a second data path through the first data path and a third data path, wherein the third data path comprises an analog-to-digital converter circuit;
determining a third latency of the first data path using a variable latency circuit based on a first difference between the second latency of the second data path and a fourth latency of the third data path; and
generating the deterministic latency in a first output signal of the variable latency circuit based on a second difference between a maximum latency of the first data path and the third latency of the first data path.

18. The method of claim 17, wherein measuring the second latency of the second data path comprises measuring the second latency of the second data path based on a third difference in timing between a calibration pattern transmitted to the digital-to-analog converter circuit and a second output signal of the analog-to-digital converter circuit generated based on the calibration pattern having propagated through the second data path.

19. The method of claim 17, wherein generating the deterministic latency in the first output signal of the variable latency circuit comprises:
  delaying the first output signal of the variable latency circuit relative to an input signal;
  increasing the first output signal of the variable latency circuit to the maximum latency of the first data path in response to the second difference between the maximum latency of the first data path and the third latency of the first data path; and
  providing the first output signal of the variable latency circuit to an input of the digital-to-analog converter circuit.

20. The method of claim 17 further comprising:
  measuring the fourth latency of the third data path using a measurement circuit based on a timing difference between a reference timing signal and a second timing signal that incurs a same latency as data propagating through the third data path.

* * * * *